(12) United States Patent
Okanobu

(10) Patent No.: US 7,979,040 B2
(45) Date of Patent: Jul. 12, 2011

(54) METHOD FOR ADJUSTING TUNING CIRCUIT AND RECEIVER CIRCUIT

(75) Inventor: Taiwa Okanobu, Tokyo (JP)

(73) Assignee: Sony Corporation, Tokyo (JP)

( * ) Notice: Subject to any disclaimer, the term of this patent is extended or adjusted under 35 U.S.C. 154(b) by 654 days.

(21) Appl. No.: 12/024,192

(22) Filed: Feb. 1, 2008

(65) Prior Publication Data
US 2008/0186115 A1    Aug. 7, 2008

(30) Foreign Application Priority Data

Feb. 5, 2007  (JP) ................. 2007-025200

(51) Int. Cl.
*H04B 1/18* (2006.01)
(52) U.S. Cl. ............. 455/180.2; 455/192.3; 455/333
(58) Field of Classification Search ........... 455/178.1, 455/179.1, 180.1–180.3, 182.3, 186.1, 188.1, 455/190.1, 190.3, 192.1–192.3, 333
See application file for complete search history.

(56) References Cited

U.S. PATENT DOCUMENTS

| | | | |
|---|---|---|---|
| 6,349,116 B1 * | 2/2002 | Hash et al. ............. | 375/258 |
| 2004/0137865 A1 * | 7/2004 | Callias et al. .......... | 455/179.1 |

FOREIGN PATENT DOCUMENTS

| | | |
|---|---|---|
| JP | 63-240116 | 10/1988 |
| JP | 04-145728 | 5/1992 |
| JP | 10-065562 | 3/1998 |
| JP | 2003-037480 | 2/2003 |
| JP | 2005-130055 | 5/2005 |
| JP | 2006-080620 | 3/2006 |
| JP | 2006-287459 | 10/2006 |

OTHER PUBLICATIONS

A Japanese Office Action dated Feb. 18, 2009 issued in connection with counterpart Japanese Patent Application No. 2007-025200.

* cited by examiner

*Primary Examiner* — Nhan Le
(74) *Attorney, Agent, or Firm* — SNR Denton US LLP

(57) ABSTRACT

Disclosed herein is a method for adjusting the tuning frequency of a tuning circuit, which is implemented as a parallel circuit of a coil and series circuits Ai each including a capacitor Ci and a switch device Qi (i=one to n, where n denotes an integer at least equal to two), by varying the tuning frequency through control to turn on and off the switch devices Qi in accordance with control data bi, the method for adjusting the tuning frequency of a tuning circuit including the steps of: finding control data bi for a desired tuning frequency from control data bi for a tuning frequency equal to a first frequency and control data bi for a tuning frequency equal to a second frequency; and applying the control data bi found for the desired tuning frequency to the switch devices Qi.

4 Claims, 9 Drawing Sheets

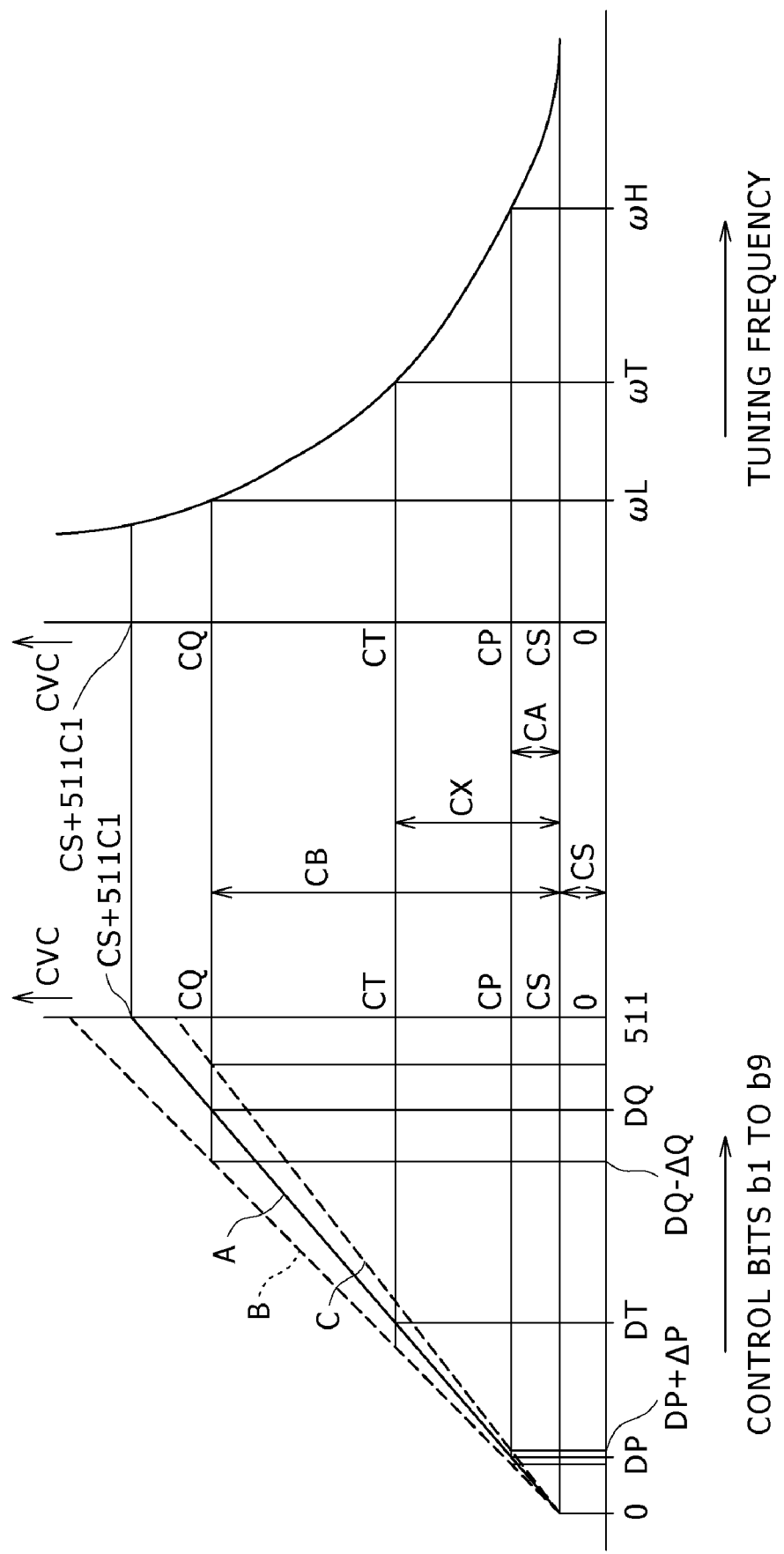

FIG.4

$$\omega L^2 = \frac{1}{L0 \cdot CQ} = \frac{1}{L0(CS+CB)} \quad \cdots\cdots\cdots (3)$$

$$\omega H^2 = \frac{1}{L0 \cdot CP} = \frac{1}{L0(CS+CA)} \quad \cdots\cdots\cdots (4)$$

$$CS = \frac{1-k^2 m}{k^2 - 1} CB \quad \cdots\cdots\cdots (5)$$

$$L0 = \frac{k^2 - 1}{\omega L^2 CB \; k^2 \; (1-m)} \quad \cdots\cdots\cdots (6)$$

$$\omega X^2 = \frac{1}{L0(CS+CX)} \quad \cdots\cdots\cdots (9)$$

$$\frac{CX}{CB} = \frac{B^2 k^2 (1-m) + k^2 m - 1}{k^2 - 1} \quad \cdots\cdots\cdots (10)$$

$$CX = \frac{CB}{k^2 - 1} \{B^2 k^2 (1-m) + k^2 m - 1\}$$

$$= \frac{k^2}{k^2 - 1} \left\{ \left(\frac{\omega L}{\omega X}\right)^2 (1-m) + m - \frac{1}{k^2} \right\} CB \quad \cdots\cdots (11)$$

$$CX = \frac{k^2}{k^2 - 1} \left\{ \left(\frac{\omega L}{\omega X}\right)^2 - \frac{1}{k^2} \right\} CB \quad \cdots\cdots (12)$$

US 7,979,040 B2

METHOD FOR ADJUSTING TUNING CIRCUIT AND RECEIVER CIRCUIT

CROSS REFERENCES TO RELATED APPLICATIONS

The present invention contains subject matter related to Japanese Patent Application JP 2007-025200 filed in the Japan Patent Office on Feb. 5, 2007, the entire contents of which being incorporated herein by reference.

BACKGROUND OF THE INVENTION

1. Field of the Invention

The present invention relates to a method for adjusting a tuning circuit and a receiver circuit.

2. Description of the Related Art

A high-frequency circuit employed in a receiver adopting a synthesizer method has a configuration like one shown in FIG. 10. As shown in the figure, broadcast signals received by an antenna 1 are supplied to an antenna tuning circuit 2 for selecting a signal SRX having the frequency of a desired broadcast. The antenna tuning circuit 2 supplies the selected signal SRX to a mixer circuit 5 by way of a high-frequency amplifier 3 and an inter-stage tuning circuit 4. In the mean time, a VCO (Voltage-Controlled Oscillator) 61 generates an oscillation signal SLO having a frequency determined in advance and supplies the signal SLO to the mixer circuit 5 as a local oscillation signal.

The antenna tuning circuit 2 is an alternating-current parallel circuit consisting of a tuning coil 2L and a variable-capacitance diode 2C. By the same token, the inter-stage tuning circuit 4 is an alternating-current parallel circuit consisting of a tuning coil 4L and a variable-capacitance diode 4C. A system control circuit 8 supplies digital tuning data D2 and D4 to a D/A conversion circuits 92 and 94 respectively. The D/A conversion circuit 92 coverts the digital tuning data D2 into an analog tuning voltage V2 and supplies the analog tuning voltage V2 to the variable-capacitance diode 2C in order to control the frequency of a signal generated by the antenna tuning circuit 2. By the same token, the D/A conversion circuit 94 coverts the digital tuning data D4 into an analog tuning voltage V4 and supplies the analog tuning voltage V4 to the variable-capacitance diode 4C in order to control the frequency of a signal generated by the inter-stage tuning circuit 4.

The VCO 61 is a portion of a PLL (Phase-Locked Loop) circuit 6. The VCO 61 also supplies the oscillation signal SLO generated thereby to a variable frequency division circuit 62 for generating a divided-frequency signal with a frequency 1/N times the frequency of the oscillation signal SLO, where notation N denotes a positive integer. The variable frequency division circuit 62 supplies the divided-frequency signal to a phase comparison circuit 63. In the mean time, a signal generation circuit 64 generates a signal having a reference frequency and supplies the reference-frequency signal to the phase comparison circuit 63.

The phase comparison circuit 63 compares the phase of the divided-frequency signal received from the variable frequency division circuit 62 with the phase of the reference-frequency signal received from the signal generation circuit 64 and supplies an output signal representing a difference in phase between the divided-frequency signal generated by the variable frequency division circuit 62 and the reference-frequency signal generated by the signal generation circuit 64 to a loop filter 65. The loop filter 65 extracts a DC voltage from the output signal received from the phase comparison circuit 63 and supplies the DC voltage to the VCO 61 as a voltage for controlling the oscillation frequency. The DC voltage has a level varying in accordance with the difference in phase between the divided-frequency signal generated by the variable frequency division circuit 62 and the reference-frequency signal generated by the signal generation circuit 64. Thus, since the frequency of the oscillation signal SLO generated by the VCO 61 is N times the reference frequency of a signal generated by the signal generation circuit 64, the frequency of the oscillation signal SLO generated by the mixer circuit 5 can be changed in accordance with control executed by the system control circuit 8 to vary the frequency-division rate N.

Receiving the oscillation signal SLO from the VCO 61 and the signal SRX of the desired broadcast from the inter-stage tuning circuit 4, the mixer circuit 5 converts the signal SRX into a signal SIF having an intermediate frequency and supplies the SIF to an intermediate-frequency circuit 7.

It is to be noted that, in this specification, the following references are used: Japanese Patent Laid-open No. 2003-037480 and Japanese Patent Laid-open No. 2006-287459.

SUMMARY OF THE INVENTION

By the way, if a variable-capacitance diode is put in an IC, the diode characteristic can generally be sustained uniformly for all diodes. However, a coil may not be put in an IC. Thus, the coil inductance of an undesirably varies from coil to coil. As a result, in the case of the high-frequency circuit employing the coils 2L and 4L as shown in FIG. 10, the inductance variations cause tracking errors in the tuning frequencies of the tuning circuits 2 and 4.

Thus, a real receiver needs to be adjusted or corrected to eliminate the tracking errors. To put it concretely, the pieces of aforementioned tuning data D2 and D4 are adjusted so as to maximize the sensitivity of signal reception for each received-signal frequency. Optimum values obtained as a result of the adjustment are then stored in a non-volatile memory for every received-signal frequency.

In this case, however, it takes much time to adjust the pieces of aforementioned tuning data D2 and D4. In addition, the non-volatile memory needs a large storage capacity. For example, in the case of medium-wave broadcasting, the frequency range is 531 kHz to 1,611 kHz and the incremental frequency step is 9 kHz. Thus, a channel count representing the number of channels for receiving broadcasts is 121 (=(1,611−531)/9+1). It is thus necessary to find optimum tuning data D2 and optimum tuning data D4 for each of the 121 channels and store the data in a non-volatile memory. If a piece of tuning data D2 or D4 consists of 9 bits, the whole tuning data D2 or D4 consists of 2,178 bits (=9 bits per channel for each tuning circuit×121 channels×2 tuning circuits). Thus, it is necessary to provide a non-volatile memory for storing the whole tuning data D2 or D4 with a size of 2,178 bits.

In order to solve this problem, there is also provided a receiver with the N-channel MOS-FET Q values of the tuning circuits 2 and 4 reduced in order to decrease the effect of tracking errors. In the case of such a receiver, however, the disturbance protection characteristic deteriorates, undesirably resulting in a reduced sensitivity of reception. In addition, in order to solve this problem, there is also provided a technique of making use of a voltage output by the loop filter 65 employed in the P-channel MOS-FET PLL circuit 6 as the tuning voltages V2 and V4. Since an intermediate frequency is the difference between the tuning frequency and the local oscillation frequency, however, it is necessary to manufacture the variable-capacitance diodes 2C and 4C as well as a variable-capacitance diode employed in the VCO 61 in order to make the intermediate frequency equal to the difference between the tuning frequency and the local oscillation frequency. However, a process of making such variable-capacitance diodes as diodes embedded in an IC is a difficult process.

In addition, other conceivable methods include a method for eliminating tracking errors in a real-time manner and a method for reducing the effect of tracking errors by changing the N-channel MOS-FET Q value in a real-time manner. However, these conceivable methods are not practical either.

According to an embodiment of the present invention, there is provided a method for adjusting the tuning frequency of a tuning circuit, which is implemented as a parallel circuit of a coil and series circuits Ai each including a capacitor Ci and a switch device Qi (i=one to n, where n denotes an integer at least equal to two), by varying the tuning frequency through control to turn on and off the switch devices Qi in accordance with control data bi, the method for adjusting the tuning frequency of a tuning circuit including the steps of: finding control data bi for a desired tuning frequency from control data bi for a tuning frequency equal to a first frequency and control data bi for a tuning frequency equal to a second frequency; and applying the control data bi found for the desired tuning frequency to the switch devices Qi.

According to an embodiment of the present invention, a tracking adjustment process can be carried out on the basis of typically two tuning frequencies so that the process can be completed in a short period of time. In addition, the amount of data obtained as a result of the tracking adjustment process as control data for tuning is extremely small, making it possible to make use of a non-volatile memory having a small storage capacity as a memory used for storing the control data for tuning.

On top of that, even in the case of a receiver for receiving broadcasts by dividing a broad band of reception into a number of sub-bands, the tracking adjustment process can be carried out with ease so that it is possible to realize a receiver having an excellent characteristic of coping with disturbances. In addition, a frequency tuned to the frequency of the signal of a desired broadcast can be set by carrying out a simple process. It is thus possible to reduce a load borne by either of software and hardware, which are required in the process for setting a frequency tuned to the frequency of the signal of a desired broadcast. In addition, since the method does not entail either special device such as a variable-capacitance diode or a high control voltage, the method for adjusting the tuning frequency of a tuning circuit can be applied to a tuning circuit put in an IC.

BRIEF DESCRIPTION OF THE DRAWINGS

These and other features of the present invention will become clear from the following description of the preferred embodiments given with reference to the accompanying diagrams, in which:

FIG. 3 is an explanatory diagram showing characteristics of the typical tuning circuit shown in FIG. 1;

FIG. 4 shows a list of equations used for explaining characteristics of the typical tuning circuit shown in FIG. 1;

DETAILED DESCRIPTION OF THE PREFERRED EMBODIMENTS

[1]: First Typical Tuning Circuit

Figure 1:
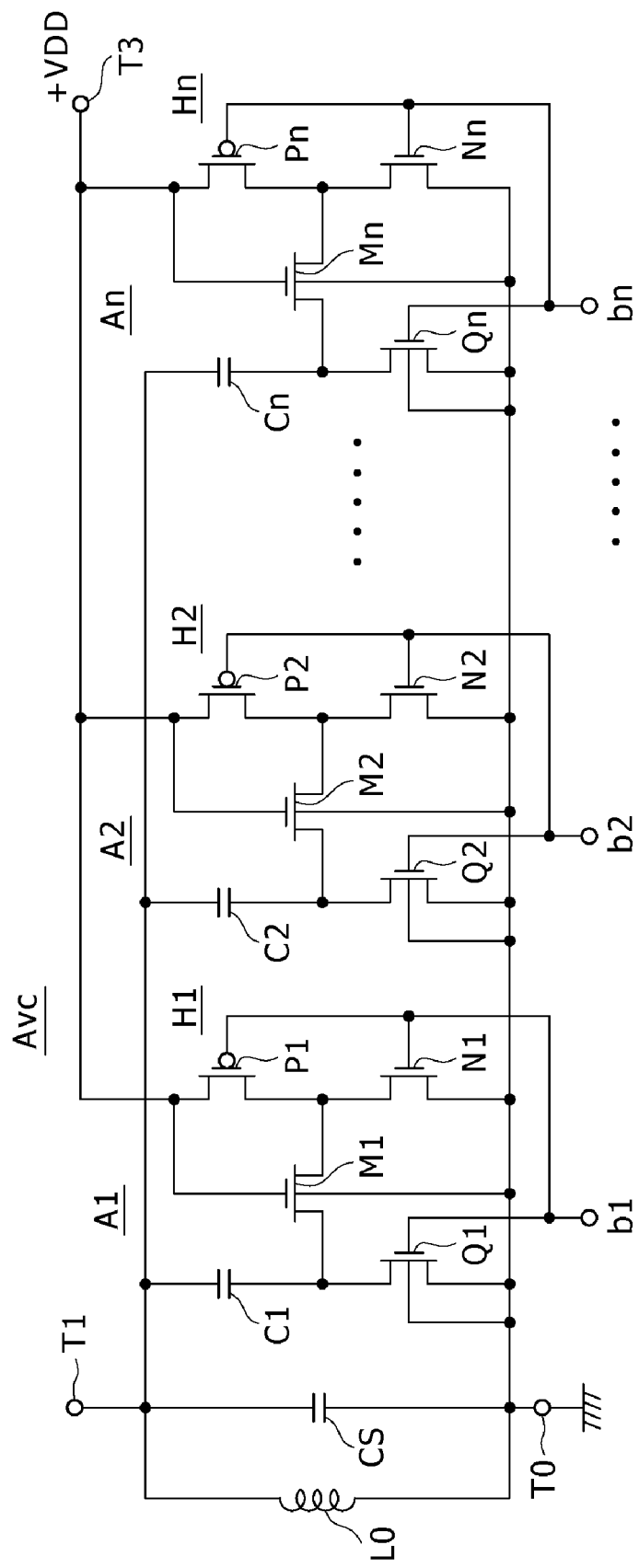
FIG. 1 is a diagram showing a first typical variable-capacitance tuning circuit, the tuning frequency of which is to be adjusted by a tuning-frequency adjustment method according to an embodiment of the present invention.

FIG. 1 is a diagram showing a typical tuning circuit, the tuning frequency of which is to be adjusted by a tuning-frequency adjustment method according to the present invention. This tuning circuit can be used as the antenna tuning circuit 2 and/or the inter-stage tuning circuit 4. The tuning circuit shown in FIG. 1 includes an external tuning coil L0 and a variable-capacitance circuit AVC having n capacitance circuits A1 to An. The capacitance of the variable-capacitance circuit AVC is changed by applying n digital control bits b1 to bn to the n capacitance circuits A1 to An in order to control the tuning frequency. Hereinafter, a subscript i in the range 1 to n.

As shown in FIG. 1, the external tuning coil L0 is connected between a terminal T0 on the ground side and a terminal T1 on the hot side. Connected to the ground, the terminal T0 is referred to hereafter as the ground terminal T0. It is to be noted that notation CS used in FIG. 1 denotes a stray capacitance observed between the terminals T1 and T0. The capacitance CS includes the stray capacitance of the external tuning coil L0 and the stray capacitance of the variable-capacitance circuit AVC.

Further, between the terminals T1 and T0, the capacitor Ci forms the series circuit in conjunction with the drain and source of the N-channel MOS-FET (Qi). The back gate of the N-channel MOS-FET (Qi) is connected to the terminal T0.

In addition, in conjunction with the drain and source of an N-channel MOS-FET (Ni), the source and drain of a P-channel MOS-FET (Pi) form a series circuit connected between a terminal T3 and the terminal T0 whereas the gates of the N-channel MOS-FET (Ni) and the P-channel MOS-FET (Pi) are connected to each other to form a CMOS-type inverter Hi. It is to be noted that the back gate of the N-channel MOS-FET (Ni) is connected to the source of the N-channel MOS-FET (Ni) whereas the back gate of the P-channel MOS-FET (Pi) is connected to the source of the P-channel MOS-FET (Pi) even though this wirings are not shown in the figure. The terminal T3 is typically connected to a power-supply voltage +VDD.

In addition, the drains of the P-channel MOS-FET (Pi) and the N-channel MOS-FET (Ni) are connected to the source of an N-channel MOS-FET (Mi). The drain of the N-channel MOS-FET (Mi) is connected to the drain of the N-channel MOS-FET (Qi) whereas the gate of the N-channel MOS-FET (Mi) is connected to the terminal T3. The back gate of the N-channel MOS-FET (Mi) is connected to the terminal T0. It is to be noted that an area occupied by the N-channel MOS-FET (Mi) in the IC is sufficiently small in comparison with an area occupied by the MOS-FET (Qi). For example, the area occupied by the N-channel MOS-FET (Mi) has a minimum size.

A digital data bit bi for controlling the tuning frequency is supplied to the gates of the N-channel MOS-FETs (Qi), (Pi) and (Ni). The capacitor Ci to Cn has a capacitance satisfying the following equation:

$$Ci = C1 \times 2^{(i-1)}$$

This variable-capacitance AVS tuning circuit shown in FIG. 1 is used as the antenna tuning circuit 2 and/or the inter-stage tuning circuit 4 and n has a value of 9. All the components except the external tuning coil L0 are embedded in a single-chip IC. Thereby, the variable-capacitance circuits Ai are configured respectively.

Figure 2A:
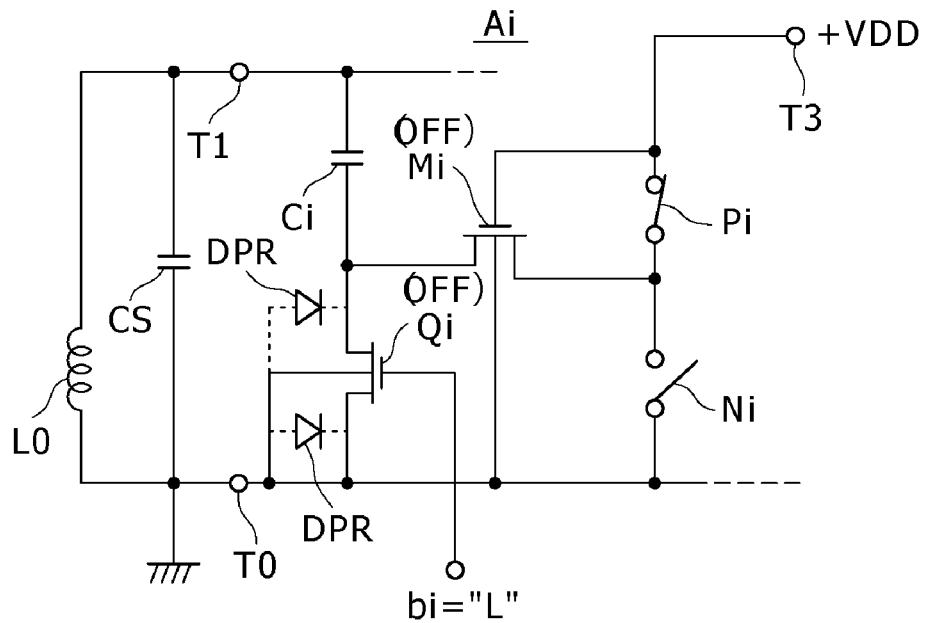
FIG. 2A is a diagram showing an equivalent circuit of the typical tuning circuit shown in FIG. 1 in a particular state.

In the configuration described above, when the control bit bi is set at a low (L) level, the N-channel MOS-FET (Qi), the N-channel MOS-FET (Ni) and the N-channel MOS-FET (Mi) are turned off whereas the P-channel MOS-FET (Pi) is turned on as shown in FIG. 2A. Thus, the capacitor Ci is disconnected from the terminals T0 and T1.

Figure 2B:
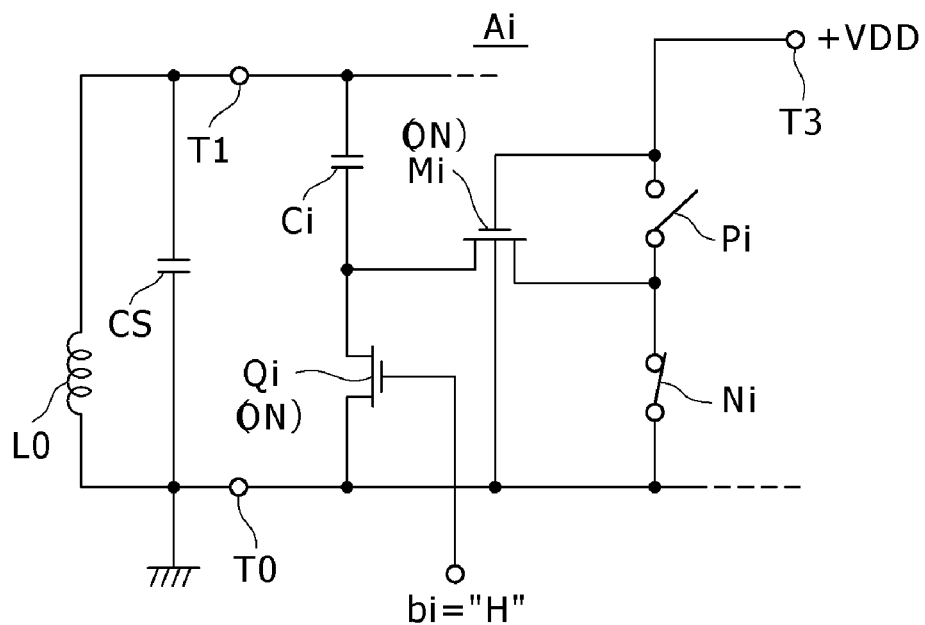
FIG. 2B is a diagram showing an equivalent circuit of the typical tuning circuit shown in FIG. 1 in another particular state.

When the control bit bi is set at an H (high) level, on the other hand, the N-channel MOS-FET (Qi), the N-channel MOS-FET (Ni) and the N-channel MOS-FET (Mi) are turned on whereas the P-channel MOS-FET (Pi) is turned off as shown in FIG. 2B. Thus, the capacitor Ci is connected between the terminals T0 and T1.

The N-channel MOS-FETs (Q1) to (Qn) can be put in on or off states in accordance with the control bits b1 to bn respectively. By the way, there are $2^n$ combinations of the states of the N-channel MOS-FETs (Q1) to (Qn). A capacitance CVC between the terminals T0 and T1 expressed as follows:

$$CVC = CS$$

$$CVC = CS + C1 \times (2^n - 1)$$

where notation CS used in the above expressions denotes the stray capacitance described before. $2^n$ values included in the above range as values of the capacitance CVC are separated from each other by a difference equal to the capacitance C1. That is to say, the variable-capacitance circuit AVC has a capacitance CVC varying discretely in the above range from any specific discrete value to another one separated by a difference equal to a multiple of the capacitance C1 in accordance with the control bits b1 to bn.

In addition, in this case, even if the capacitances of the capacitors C1 to Cn embedded in the IC are erroneous, the relative errors are small. Thus, the capacitance CVC changes linearly in accordance with the control bits b1 to bn. Strictly speaking, the capacitance CVC changes not linearly but step by step determined by the capacitance C1. In essence, however, the capacitance CVC is seen as a capacitance changing linearly in accordance with the control bits b1 to bn.

FIG. 3 is a characteristic diagram showing a relation between the value of the control bits b1 to bn and the capacitance CVC as well as a relation between the capacitance CVC and the tuning frequency. To put it in detail, FIG. 3A shows a relation between the value represented by the horizontal axis as the value of the control bits b1 to bn and the capacitance CVC represented by the vertical axis whereas FIG. 3B shows a relation between the capacitance CVC represented by the vertical axis and the tuning frequency represented by the horizontal axis.

The characteristic lines shown in FIG. 3 are drawn for n=9 corresponding to the number of control bits b1 to b9, which have a value changing from 0 to 511. If the value of the control bits b1 to b9 is changed from 0 to 511, the capacitance CVC changes from the minimum value CS, to the maximum value of CS+511×C1 as shown by a solid straight line A in FIG. 3A. Strictly speaking, the capacitance CVC changes linearly step by step having a magnitude equal to the capacitance C1 of the capacitor C1.

It is to be noted that, even if the capacitance of each of the capacitors C1 to Cn includes an absolute error, when manufacturing IC, the error relative to the capacitance is small. Thus, the absolute errors merely change the gradient of the change-characteristic line of the capacitance CVC as shown by dashed straight lines B and C in FIG. 3A. That is to say, the actual design characteristic is represented by a range having the solid straight line A as a center line of the range and the dashed straight lines B and C as upper and lower limit lines of the range.

Notations used in FIG. 3 are explained as follows:

CQ: denotes a capacitance CVC corresponding to the lowest tuning frequency (or the lowest tuning angular frequency) $\omega L$;

CP: denotes a capacitance CVC corresponding to the highest tuning frequency (or the highest tuning angular frequency) $\omega H$;

DQ: denotes a design value given by the control bits b1 to bn as a control data value providing the capacitance CQ; and DP: denotes a design value given by the control bits b1 to bn as a control data value providing the capacitance CP.

Thus, the value of control data (control bits b1 to bn) for acquiring any arbitrary capacitance CT can be found by a simple calculation based on the principle of proportion from the design data values DP and DQ.

If errors of the capacitance CVC are taken into consideration, additional notations are used in FIG. 3 and described as follows:

ΔQ: denotes a design difference value given by the control bits b1 to b9 as a control data difference value representing an error of the design value DQ; and ΔP: denotes a design difference value given by the control bits b1 to b9 as a control data difference value representing an error of the design value DP.

Thus, the actual range of the value of the control bits b1 to b9 is a range from a value of (DQ−ΔQ) corresponding to the capacitance CQ to a value of (DP+ΔP) corresponding to the capacitance CP.

Next, a relation between the capacitance CVC and the tuning frequency (also referred to as a resonant frequency) is taken into consideration. It is to be noted that, in the following description, the errors of the capacitance CVC are ignored for the sake of simplicity.

In the capacitance-frequency characteristic diagram of FIG. 3B, the following equations hold true:

$$CQ = CS + CB \quad (1)$$

$$CP = CS + CA \quad (2)$$

By substituting the right-hand expressions of Equations (1) and (2) into the above equations for CQ and CP respectively, Equations (3) and (4) shown in FIG. 4 can be derived.

Here k and m denote ratios satisfying the following equations respectively:

$$\omega H / \omega L = k \text{ (thus, } k > 1\text{)}$$

$$CA / CB = m \text{ (thus, } m < 1\text{)}$$

where:

notation ωL denotes the lowest tuning frequency (or the lowest tuning angular frequency); whereas notation ωH denotes the highest tuning frequency (or the highest tuning angular frequency).

From Equations (3) and (4), Equations (5) and (6) shown in FIG. 4 are derived as equations making use of the quantities k and m.

Then:

notation ωT denote any tuning frequency (or any tuning angular frequency); and notation CT denote a capacitance CVC that gives the tuning frequency ωT.

Here, $$CT = CS + CX \quad (7)$$

$$\omega L/\omega X = B \quad (8)$$

In this case, Equation (9) shown in FIG. 4 holds true.

Then the expressions of Equations (5), (6) and (8) are substituted into Equation (9) and Equation (10) shown in FIG. 4 is obtained.

Then the Equation (8) is substituted into Equation (10) and Equation (11) shown in FIG. 4 is obtained.

Notation k used in Equation (11) denotes a ratio of the highest tuning frequency ωH to the lowest tuning frequency ωL as described above. Thus, the ratio k has a constant value corresponding to the reception band. Also as described above, notation m used in Equation (11) denotes the ratio of the relative capacitance CA to the relative capacitance CB where notation CB denotes the difference between the capacitance CQ corresponding to the lowest tuning frequency ωL as shown in FIG. 3B and the minimum capacitance CS in accordance with Equation (1) whereas notation CA denotes the difference between the capacitance CP corresponding to the highest tuning frequency ωH as shown in FIG. 3B and the minimum capacitance CS in accordance with Equation (2). As shown in FIG. 3A, the capacitance value between the capacitances CQ and CP changes proportionally with the data value of the control bits b1 to b9. Thus, the capacitance value between the capacitances CQ and CP may be substituted for the data value of the control bits b1 to b9.

That is to say, in accordance with Equation (11), a relative capacitance CX of arbitrary frequency ωT can be found from the ratio k: a ratio of the highest tuning frequency ωH to the lowest tuning frequency ωL; the ratio k: a ratio of the relative capacitance CA to the relative capacitance CB of the highest tuning frequency ωH and the lowest tuning frequency ωL; the lowest tuning frequency ωL; and the relative capacitance CB of the lowest tuning frequency ωL.

Then, the relative capacitance CX found in accordance with Equation (11) can be converted into a value of the control bits b1 to b9 by carrying out a simple calculation from a data value assigned to the control bits b1 to b9 as a value associated with the lowest tuning frequency ωL and a data value assigned to the control bits b1 to b9 as a value associated with the highest tuning frequency ωH even if the values of the control bits b1 to b9 have the errors ΔQ and ΔP as shown by the dashed straight lines B and C as well as the solid straight line A in FIG. 3A.

Thus, if the data value assigned to the control bits b1 to b9 as a value associated with the lowest tuning frequency ωL and the data value assigned to the control bits b1 to b9 as a value associated with the highest tuning frequency ωH are found in advance, a value DT assigned to the control bits b1 to b9 as a value corresponding to the relative capacitance CX for any arbitrary tuning frequency ωX (or ωT shown in FIG. 3B) can be found.

Accordingly, at the time a receiver is manufactured at the factory and/or at the time the receiver is shipped from the factory, a tracking adjustment process is carried out through adjustment steps (21) to (28) described below.

(21): The local oscillation frequency is set at a value corresponding to the lowest tuning frequency ωL.

(22): For example, a test signal having a frequency equal to the lowest tuning frequency ωL is supplied from a signal generator to the tuning circuit.

(23): At that time, the data value of the control bits b1 to b9 is adjusted in order to set the capacitance CVC at the value CQ that gives the highest level of reception.

(24): A data value DQ obtained as a result of adjusting the control bits b1 to b9 is stored in a non-volatile memory in advance.

(25): The local oscillation frequency is set at a value corresponding to the highest tuning frequency ωH.

(26): A test signal having a frequency equal to the highest tuning frequency ωH is supplied from the signal generator to the tuning circuit.

(27): At that time, the data value of the control bits b1 to b9 is adjusted in order to set the capacitance CVC at the value CP that gives the highest level of reception.

(28): A data value DP obtained as a result of adjusting the control bits b1 to b9 is stored in the non-volatile memory in advance.

The following adjustment step is executed in the field in carrying out a process to receive a signal of a desired broadcast.

(29): The control bits b1 to b9 (data value DT) as a value corresponding to the received frequency (tuning frequency ωT) can be found by interpolation based on data stored in the non-volatile memory at the factory adjustment steps (24) and (28) as respectively the data values DQ and DP of the control bits b1 to b9 and the Equation (11). The data value DT can then be set in the tuning circuit. In addition, the local oscillation frequency can then be set at a value corresponding to the tuning frequency ωT.

In this way, tracking errors can be suppressed sufficiently so as to allow broadcasts to be received at a high sensitivity.

In addition, in this case, it is necessary to store 36 bits (=9 bits×2 frequencies×2 tuning circuits) without regard to the width of the band of reception and the incremental frequency step, where the 9 bits are the number of bits serving as the control bits b1 to b9, the 2 frequencies are the lowest tuning frequency ωL and the highest tuning frequency ωH and the 2 tuning circuits are the two tuning circuits employed in a receiver. Thus, the storage capacity of the non-volatile memory can be reduced substantially. In addition, it is necessary to carry out an adjustment process at the factory for two frequencies, i.e., the lowest tuning frequency ωL and the highest tuning frequency ωH. Thus, the time it takes to carry out the adjustment process can be shortened considerably.

In addition, due a manufacturing process, parasitic diodes DPR shown by dashed lines in FIG. 2A are undesirably created between the drain and back gate of the N-channel MOS-FET (Qi) employed in the tuning circuit shown in FIG. 1 as well as between the back gate and source of the N-channel MOS-FET (Qi). Since the N-channel MOS-FET (Mi) is employed in the tuning circuit, however, effects of the parasitic diodes DPR can be eliminated.

That is to say, the parasitic diode DPR created between the drain and back gate of the N-channel MOS-FET (Qi) forms a series circuit between the terminals T0 and T1 in conjunction with the capacitance Ci. With the N-channel MOS-FET (Qi) turned on as shown in FIG. 2B, however, the parasitic diode DPR is shunted by the on resistance of the N-channel MOS-FET (Qi) so that the parasitic diode DPR does not raise a big problem.

With the N-channel MOS-FET (Qi) turned off as shown in FIG. 2A, on the other hand, if the amplitude of an input signal supplied between the terminals T0 and T1 exceeds 0.5 Vp, the parasitic diode DPR is turned on. In this state, the parasitic diode DPR rectifies the input signal. Thus, a DC electric potential difference is undesirably generated between the drain and source of the N-channel MOS-FET (Qi) and, in addition, the DC electric potential difference changes in accordance with the amplitude of the input signal.

As a result, the equivalent capacitance of the parasitic diode DPR changes in accordance with the input signal. In addition, the parasitic diode DPR is connected to the terminal T1 through the capacitance Ci so that, as a result, the total capacitance CVC seen between the terminals T0 and T1 undesirably changes in accordance with the input signal.

On top of that, even if no large input signal is supplied between the terminals T0 and T1, a DC electric potential difference appearing between the ends of the parasitic diode DPR is 0 V so that the junction capacitance of the parasitic diode DPR is relatively large. In addition, the voltage of the input signal is applied to the parasitic diode DPR though the capacitance Ci. As a result, the voltage of the input signal causes the junction capacitance of the parasitic diode DPR to change, and the changes in junction capacitance are large. On top of that, the changes in junction capacitance are undesirably observed in an area exhibiting much non-linearity.

Thus, in the tuning circuit shown in FIG. 1, the input signal may be much distorted. If the tuning circuit is employed in a receiver for example, the receiver may be incapable of receiving a strong input signal.

In the tuning circuit shown in FIG. 1, however, due to the bit bi, if the N-channel MOS-FET (Qi) is turned off, the P-channel MOS-FET (Pi) is turned on while the N-channel MOS-FET (Ni) and the N-channel MOS-FET (Mi) are also turned off. Thus, a leak current flows through the following path: the terminal T3→the gate and drain of the N-channel MOS-FET (Mi)→the drain and source of the N-channel MOS-FET (Qi)→the terminal T0. This current causes a voltage (VDD−VGS) to be applied to the parasitic diode DPR as a reverse bias. It is to be noted that the voltage VGS is a voltage appearing between the gate and source of the N-channel MOS-FET (Mi). The voltage VGS can be found from the leak current of the N-channel MOS-FET (Qi) and the leak current of the N-channel MOS-FET (Mi).

Thus, by setting the bias voltage +VDD at a level determined in advance, the junction capacitance of the parasitic diode DPR can be reduced and the junction capacitance changes caused by input signal variations can also be decreased. As a result, generation of distortions can be suppressed as well. In addition, the size of the N-channel MOS-FET (Mi) can be minimized so that the tuning circuit can be put in a single-chip IC.

On top of that, with the control bit bi set at a H (high) level turning on the N-channel MOS-FET (Qi), the P-channel MOS-FET (Pi) is turned off. Thus, even if the bias voltage +VDD of the terminal T3 leaks to the N-channel MOS-FET (Mi) through the P-channel MOS-FET (Pi), the P-channel MOS-FET (Pi) is in an off state. As a result, the bias voltage +VDD leaking to the N-channel MOS-FET (Mi) through the P-channel MOS-FET (Pi) is seen as no more than a voltage leak corresponding to the leak current of the P-channel MOS-FET (Pi). Accordingly, the bias voltage +VDD leaking to the N-channel MOS-FET (Mi) through the P-channel MOS-FET (Pi) can be ignored.

[2]: Second Typical Tuning Circuit

Figure 5:
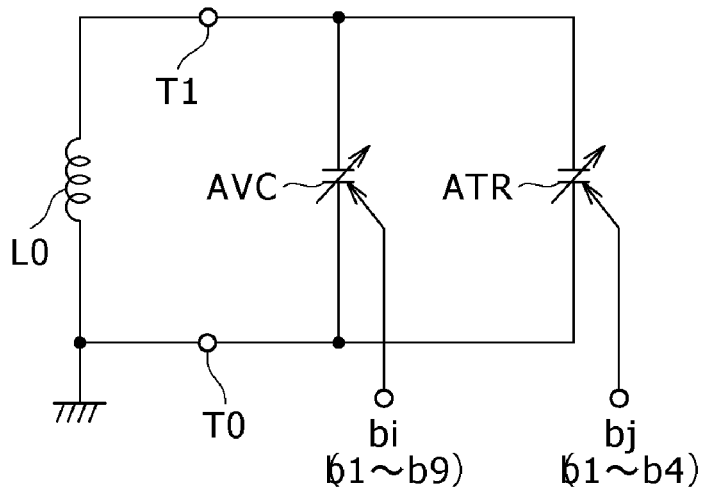
FIG. 5 is a diagram showing a second typical variable-capacitance tuning circuit according to an embodiment of the present invention.
Figure 6:
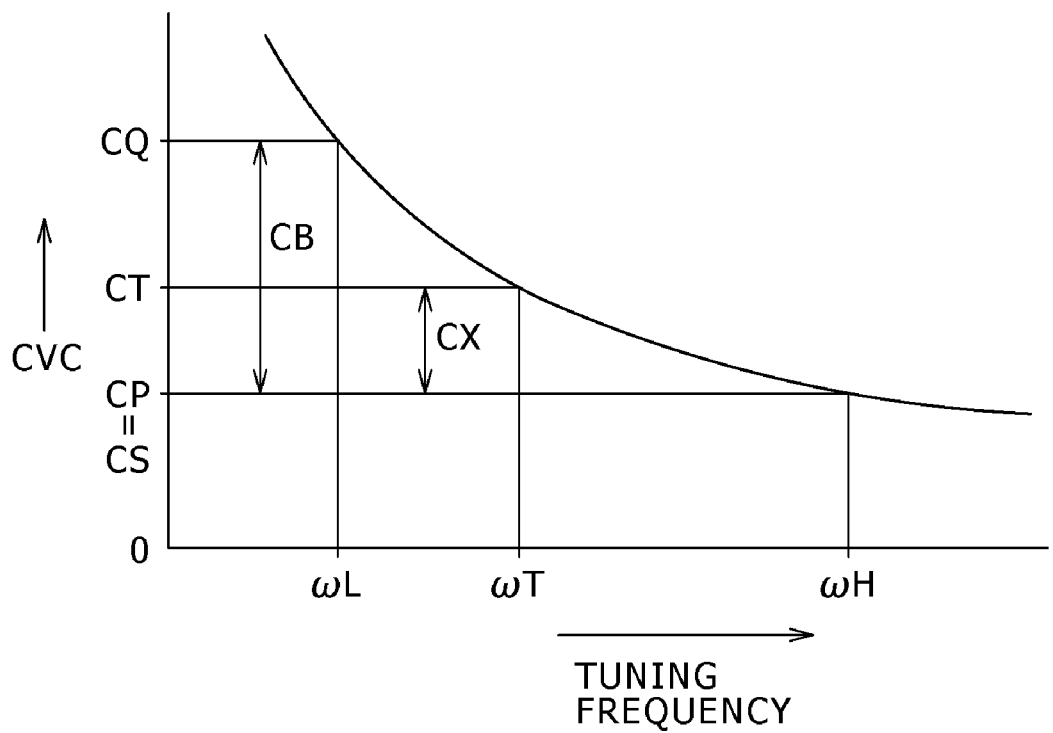
FIG. 6 is an explanatory diagram showing a characteristic of the typical variable-capacitance tuning circuit shown in FIG. 5.

FIG. 5 is a diagram showing a second typical tuning circuit employing a variable-capacitance circuit AVC for carrying out a main tuning operation and a variable-capacitance circuit ATR for carrying out a tracking adjustment operation. In the case of the second typical tuning circuit, the variable-capacitance circuit AVC and ATR each have a configuration identical with that of the tuning circuit shown in FIG. 1. In the variable-capacitance circuit AVC, however, the capacitance difference CA is 0 as shown in FIG. 6.

Control bits bi are supplied to the variable-capacitance circuit AVC whereas control bits bj are supplied to the variable-capacitance circuit ATR. As an example, the number of control bits bi supplied to the variable-capacitance circuit AVC is 9 or i=1 to 9, whereas the number of control bits bj supplied to the variable-capacitance circuit ATR is 4 or j=1 to 4.

Thus, since m=0, Equation (11) shown in FIG. 4 can be rewritten into Equation (12) shown in the same figure.

The tuning circuit shown in FIG. 5 is so designed that the inductance of a tuning coil L0, the capacitance CVC of the variable-capacitance circuit AVC and the capacitance CTR of the variable-capacitance circuit ATR satisfy the following conditions. For CVC=CP (=CS) and the capacitance CTR set in the middle of the capacitance variation range, the tuning circuit has a tuning frequency equal to the highest tuning frequency ωH. For CVC=CQ and the capacitance CTR set in the middle of the capacitance variation range, on the other hand, the tuning circuit has a tuning frequency equal to the lowest tuning frequency ωL.

Thus, the variable-capacitance circuit AVC can be used for carrying out a main tuning operation whereas the variable-capacitance circuit ATR can be used for carrying out a tracking adjustment operation.

(31): The local oscillation frequency is set at a value corresponding to the highest tuning frequency ωH.

(32): The data value of the control bits bi supplied to the variable-capacitance circuit AVC is minimized in order to set the capacitance CVC at the value CP (=CS).

(33): At that time, the data value of the control bits bj supplied to the variable-capacitance circuit ATR is adjusted in a tracking adjustment operation in order to provide a tuning frequency equal to the highest tuning frequency ωH.

(34): A data value obtained as a result of adjusting the control bits bj is stored in a non-volatile memory in advance.

(35): The local oscillation frequency is set at a value corresponding to the lowest tuning frequency ωL.

(36): A value stored at the adjustment step (34) as the data value of the control bits bj is supplied to the variable-capacitance circuit ATR.

(37): At that time, the data value of the control bits bi supplied to the variable-capacitance circuit AVC is adjusted in a tracking adjustment operation in order to provide a tuning frequency equal to the lowest tuning frequency ωL.

(38): A data value obtained as a result of adjusting the control bits bi are stored in the non-volatile memory in advance.

The following adjustment step is executed in the field in carrying out a process to receive the signal of a desired broadcast.

(39): The control bits bi as a value corresponding to the received frequency (tuning frequency ωT) of a desired broadcast is found in accordance with Equation (12) and set the value to the tuning circuit.

(40): The value of the control data bj in the tuning frequency ωT can be found by the values of the control bits bj and bi stored as in the above described steps (34) and (38) and the Equation (12), which are to be supplied to the variable-capacitance circuit ATR in a tracking adjustment operation. It is to be noted that the local oscillation frequency can then be set at a value corresponding to the tuning frequency ωT.

In this way, the variable-capacitance circuit ATR is capable of compensating the variable-capacitance tuning circuit for errors contained in the capacitance CVC of the variable-capacitance circuit AVC. As a result, tracking errors can be suppressed sufficiently.

[3]: Third Typical Tuning Circuit

Figure 7:
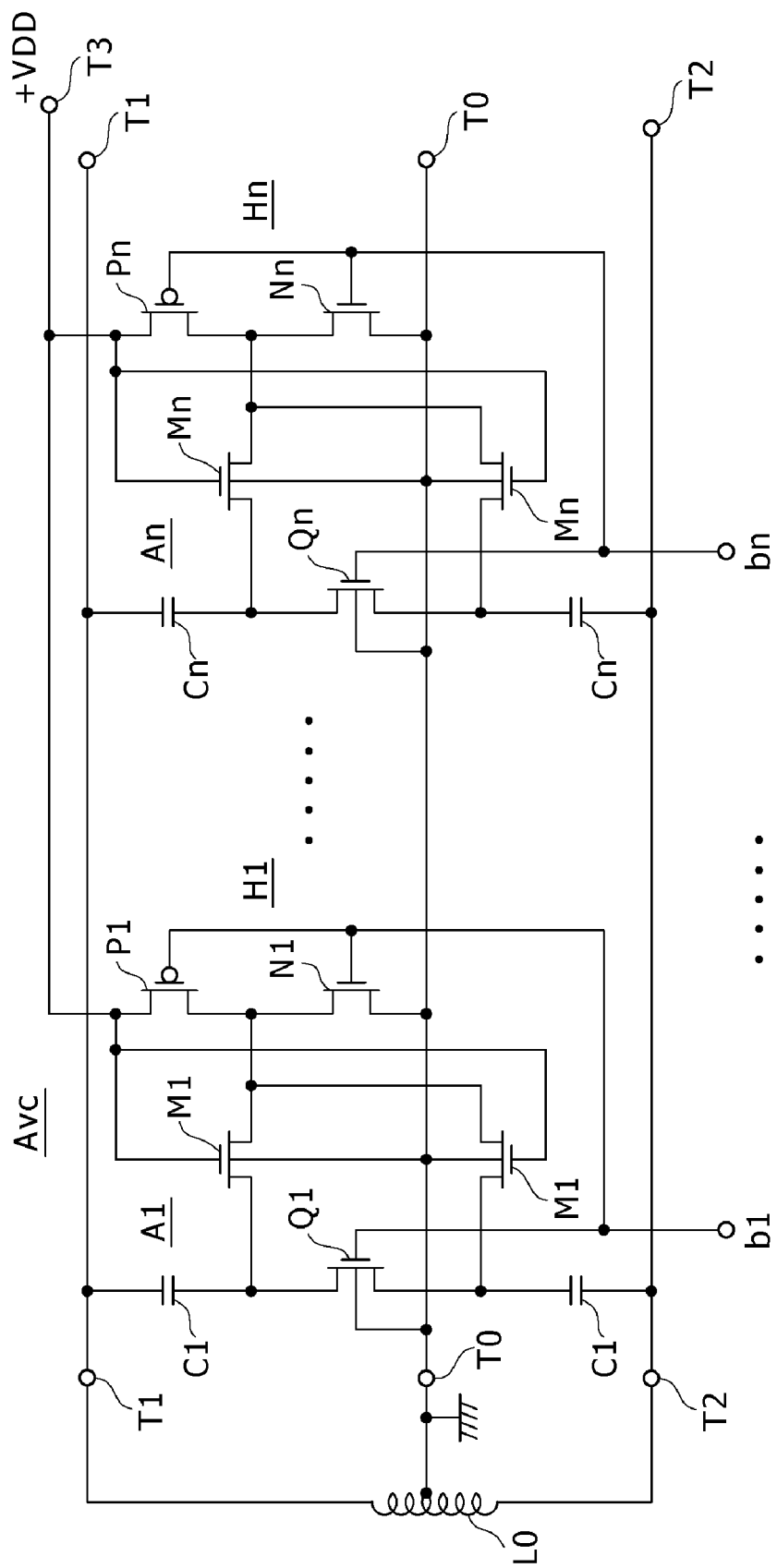
FIG. 7 is a diagram showing a third typical variable-capacitance tuning circuit according to an embodiment of the present invention.

FIG. 7 is a diagram showing a tuning circuit shown in FIG. 2 into a balanced configuration. As shown in the configuration, a tuning coil L0 is connected between terminals T1 and T2. The middle point of the tuning coil L0 is connected to the terminal T0 of the ground. A series circuit is also connected between the terminals T1 and T2. The series circuit consists of a first capacitor Ci, the drain and source of a MOS-FET (Qi) as well as a second capacitor Ci. The back gate of the N-channel MOS-FET (Qi) is connected to the ground terminal T0.

In conjunction with a MOS-FET (Ni) and a MOS-FET (Pi) forms a series circuit connected between a power-supply terminal T3 and the ground terminal T0 whereas the gates of the N-channel MOS-FET (Ni) and the P-channel MOS-FET (Pi) are connected to each other to form a CMOS-type inverter Hi. An operating voltage +VDD is applied between a power-supply terminal T3 and the ground terminal T0. The drains of the P-channel MOS-FET (Pi) and the N-channel MOS-FET (Ni) are connected to the source of N-channel MOS-FETs (Mi). The operating voltage +VDD generated by the power-supply terminal T3 is also supplied to the gate of the N-channel MOS-FETs (Mi) as a bias voltage. The drain of one of the N-channel MOS-FETs (Mi) is connected to the source of the N-channel MOS-FET (Qi) whereas the drain of the other N-channel MOS-FET (Mi) is connected to the drain of the N-channel MOS-FET (Qi). The back gates of the N-channel MOS-FETs (Mi) are connected to the ground terminal T0. It is to be noted that an area occupied by each of the N-channel MOS-FETs (Mi) is sufficiently small in comparison with an area occupied by the N-channel MOS-FET (Qi).

The digital control of the bit bi is supplied to the gates of the N-channel MOS-FET (Qi), the P-channel MOS-FET (Pi) and the N-channel MOS-FET (Ni).

In the above configuration, the bit bi controls the N-channel MOS-FETs (Qi) in the same way as the tuning circuit shown in FIG. 1. Thus, a balanced variable capacitance can be obtained between the terminals T1 and T2. In addition, in the case of the tuning circuit shown in FIG. 7, a pair of aforementioned capacitors Ci is controlled by making use of one MOS-FET (Qi). Thus, the tuning circuit shown in FIG. 7 has a Q value twice the N-channel MOS-FET Q value of the tuning circuit shown in FIG. 1.

In addition, both the terminals T1 and T2 are on the hot side. Thus, as will be described later, if the variable-capacitance circuit is used by floating from the ground, the variable-capacitance circuit AVC is effective.

[4]: Fourth Typical Tuning Circuit

In the variable-capacitance tuning circuit shown in FIG. 7, as described earlier by referring to FIG. 2A, parasitic diodes DPR shown by dashed lines in FIG. 2A are undesirably created between the drain and back gate of the N-channel MOS-FET (Qi) as well as between the back gate and source of the N-channel MOS-FET (Qi) when the MOS-FET Qi is in an off state. In addition, a leak current is flowing through each of the parasitic diodes DPR. The leak currents change considerably due to changes in temperature. In accordance with the size and characteristic of each of the N-channel MOS-FET (Qi) and the N-channel MOS-FETs (Mi), there is observed a phenomenon in which the leak current flowing through each of the parasitic diodes DPR is smaller than a leak current flowing through the drain and source of each of the N-channel MOS-FETs (Mi) at a low temperature but the leak current flowing through each of the parasitic diodes DPR is greater than a leak current flowing through the drain and source of each of the N-channel MOS-FETs (Mi) at a high temperature.

As a result, at a low temperature, a voltage applied to the N-channel MOS-FET (Qi) is approximately equal to the voltage +VDD. At a high temperature higher than a threshold temperature TTH, however, the voltage applied to the N-channel MOS-FET (Qi) undesirably becomes equal to a voltage of (VDD−VGS). Thus, the junction capacitance of each of the parasitic diodes DPR undesirably varies by a capacitance change greater than a change caused by a normal change in temperature when the temperature rises, crossing the threshold temperature TTH. As a result, the resulting frequency (or the resulting angular frequency) ωT tuned to the frequency of the signal of a desired broadcast undesirably changes.

Figure 8:
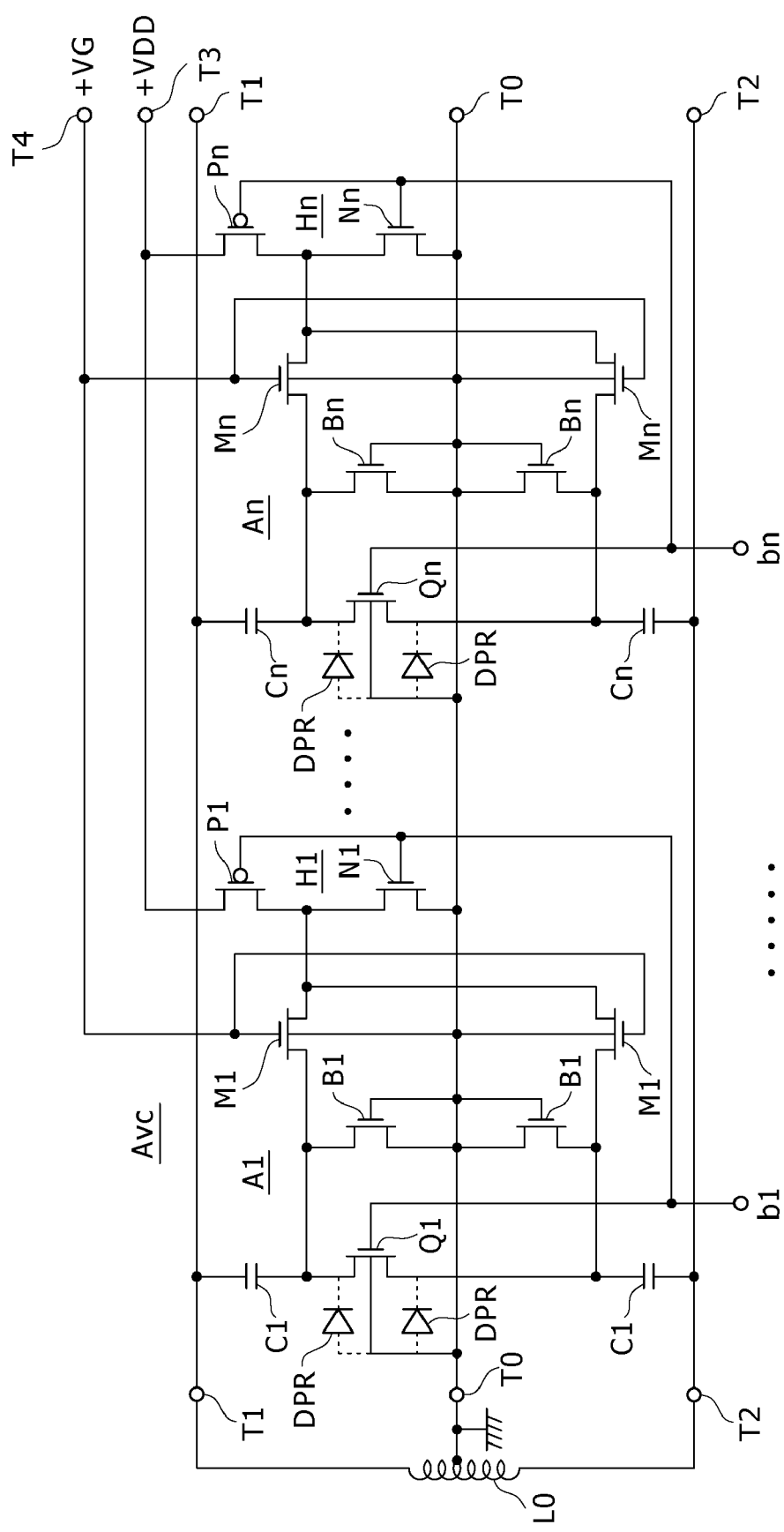
FIG. 8 is a diagram showing a fourth typical variable-capacitance tuning circuit according to an embodiment of the present invention.

FIG. 8 is a diagram showing a variable-capacitance circuit AVC for suppressing changes in resulting desired tuning frequency ωT by suppressing capacitance changes observed in the variable-capacitance circuit AVC shown in FIG. 7 as capacitance changes caused by temperature changes. In the circuit as shown in FIG. 8 further includes a MOS-FET (Bi) with its drain and source connected between the source of the N-channel MOS-FET (Qi) and the ground terminal T0 as well as another MOS-FET (Bi) with its drain and source connected between the drain of the N-channel MOS-FET (Qi) and the ground terminal T0. The gates of the MOS-FETs (Bi) are connected to the ground terminal T0. It is to be noted that the gates of the MOS-FETs (Mi) are connected to a terminal T4 receiving a voltage +VG having a temperature coefficient ranging from zero to a positive value.

Thus, since the leak current flowing to the N-channel MOS-FET (Qi) and the leak currents of the MOS-FETs (Bi) flow to the MOS-FETs (Mi), at a low temperature, a total leak current flowing to each of the MOS-FETs (Mi) increases. As a result, also at a low temperature, a voltage of (VDD−VGS) is applied to each of the parasitic diodes DPR so that the temperature characteristic is improved.

In addition, since the gates of the MOS-FETs (Mi) are connected to the terminal T4 receiving a voltage +VG having a temperature coefficient ranging from zero to a positive value, temperature changes exhibited by each of the parasitic diodes DPR can be eliminated if the temperature characteristic of the voltage VG is properly set by considering the temperature characteristic exhibited by the junction capacitance of each of the parasitic diodes DPR, the voltage VGS appearing between the gate and source of the N-channel MOS-FET (Mi) and the temperature characteristic of a current flowing through each of the MOS-FETs (Bi). It is to be noted that, normally, the temperature characteristic exhibited by the junction capacitance of each of the parasitic diodes DPR is a positive temperature characteristic.

In addition, by increasing the temperature coefficient of the voltage VG, changes caused by temperature variations as changes of the capacitance of an electrostatic protection diode and a stray capacitance between the terminals T1 and T2 can be eliminated.

[5]: Typical Receiver Circuit

The following description explains a typical receiver making use of a tuning circuit according to an embodiment of the present invention.

Figure 9:
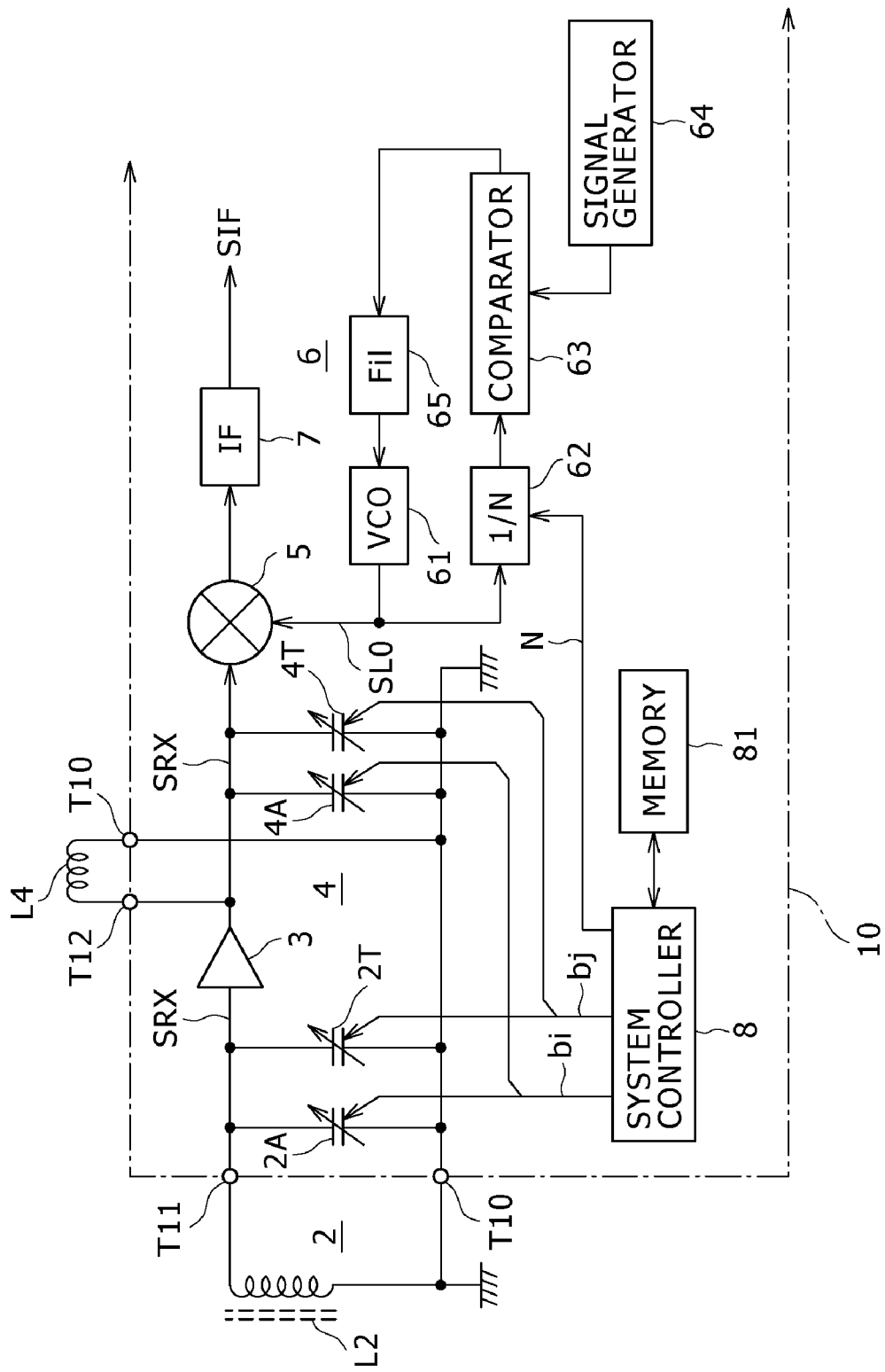
FIG. 9 is a diagram showing the circuit of a receiver employing variable-capacitance tuning circuits according to an embodiment of the present invention.
Figure 10:
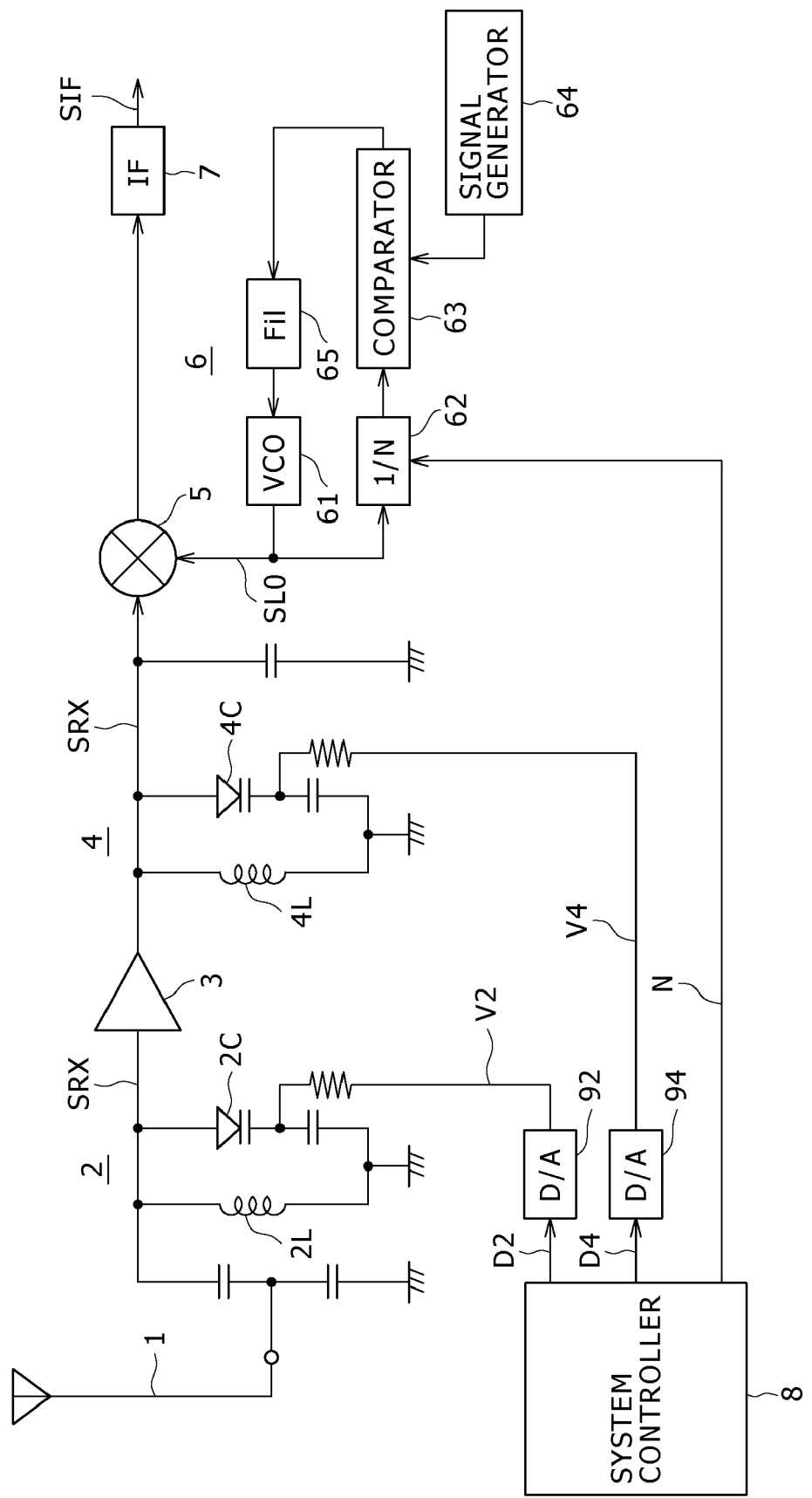
FIG. 10 is a diagram a receiver circuit used for explaining the present invention.

A portion 10 enclosed by a dotted-dashed line in FIG. 9 is a receiver circuit, which is implemented in a single-chip IC. The receiver-circuit IC 10 has terminal pins T10 to T12 for connecting the receiver-circuit IC 10 to external devices.

An external bar antenna coil L2 is connected to the receiver-circuit IC 10 between the terminal T11 on the hot side and the terminal T10 on the ground side. Variable-capacitance circuits 2A and 2T forming a parallel circuit are also connected between the terminal pins T11 and T10. The external bar antenna coil L2 forms an antenna tuning circuit 2 in conjunction with the variable-capacitance circuits 2A and 2T. Typically, the variable-capacitance circuits 2A and 2T are respectively the variable-capacitance circuit AVC and the variable-capacitance circuit ATR, which are employed in the second typical variable-capacitance tuning circuit explained earlier by referring to FIG. 5.

The antenna tuning circuit 2 selects a received signal SRX having a frequency matching a desired tuning frequency and supplies the signal SRX to a mixer circuit 5 by way of a high-frequency amplifier 3 and an inter-stage tuning circuit 4. The inter-stage tuning circuit 4 employs an external tuning coil L4 as well as variable-capacitance circuits 4A and 4T forming a parallel circuit. By the same token, the variable-capacitance circuits 4A and 4T are respectively the variable-capacitance circuit AVC and the variable-capacitance circuit ATR, which are employed in the second typical variable-capacitance tuning circuit explained earlier explained earlier by referring to FIG. 5. It is to be noted that the external tuning coil L4 is connected to the receiver-circuit IC 10 between the terminal T12 and the terminal T10 on the ground side.

The inter-stage tuning circuit 4 outputs a received signal SRX to the mixer circuit 5. In the mean time, a VCO 61 generates an oscillation signal SLO having a frequency determined in advance and supplies the signal SLO to the mixer circuit 5 as a local oscillation signal. The VCO 61 is a portion of a PLL circuit 6. The VCO 61 also supplies the oscillation signal SLO generated thereby to a variable frequency division circuit 62 for generating a divided-frequency signal with a frequency 1/N times the frequency of the oscillation signal SLO, where notation N denotes a positive integer. The variable frequency division circuit 62 supplies the divided-frequency signal to a phase comparison circuit 63. In the mean time, a signal generation circuit 64 generates a signal having a reference frequency and supplies the reference-frequency signal to the phase comparison circuit 63.

The phase comparison circuit 63 compares the phase of the divided-frequency signal received from the variable frequency division circuit 62 with the phase of the reference-frequency signal received from the signal generation circuit 64 and supplies an output signal representing a difference in phase to a loop filter 65. The loop filter 65 extracts a DC voltage from the output signal received from the phase comparison circuit 63 and supplies the DC voltage to the VCO 61 as a voltage for controlling the oscillation frequency. The DC voltage has a level varying in accordance with the difference in phase between the divided-frequency signal generated by the variable frequency division circuit 62 and the reference-frequency signal generated by the signal generation circuit 64. Thus, since the frequency of the oscillation signal SLO generated by the VCO 61 is N times the reference frequency of a signal generated by the signal generation circuit 64, the frequency of the oscillation signal SLO can be changed in accordance with control executed by the system control circuit 8 to vary the frequency-division rate N.

Receiving the oscillation signal SLO from the VCO 61 and the signal SRX of the desired broadcast from the inter-stage tuning circuit 4, the mixer circuit 5 converts the signal SRX into a signal SIF having an intermediate frequency and supplies the SIF to an intermediate-frequency circuit 7.

The receiver also includes a system control circuit 8 typically implemented by a microcomputer. The system control circuit 8 supplies tuning control bits bi and tuning control bits bj to the variable-capacitance circuits 2A and 2T respectively as well as to the variable-capacitance circuits 4A and 4T respectively. The system control circuit 8 is connected to a non-volatile memory 81 used for storing various kinds of data such as tracking adjustment data in advance.

Thus, at the time the receiver circuit is manufactured at a factory and/or the time the receiver circuit is shipped from the factory, a tracking adjustment process according to the adjustment steps (21) to (28) is carried out to maximize the level of the intermediate-frequency signal SIF generated by the intermediate-frequency circuit 7. Results of the tracking adjustment process are then stored in the non-volatile memory 81 in advance.

Then, at the time of receiving a desired broadcast, the control bits bi corresponding to the desired received frequency (tuning frequency ωT) is found from the value of the control bits bi stored in the above steps (24) and (28) and Equation (11). Then set the acquired control bits bi to variable-capacitance circuit 2A and 4A. Further, the control data bj for tracking, which is found as in the same way as the control bits bi, is set to the variable-capacitance circuits 2T and 4T. Then, the local oscillation frequency can then be set at a value corresponding to the received frequency (tuning frequency ωT) tuned to the frequency of the signal of a desired broadcast by determining a proper value for the frequency division rate N of the variable frequency division circuit 62.

In this way, tracking errors can be suppressed sufficiently so as to allow broadcasts to be received at a high sensitivity.

In addition, in this case, it is necessary to store 36 bits in the non-volatile memory 81 without regard to the width of the band of reception and the incremental frequency step. Thus, the storage capacity of the non-volatile memory 81 can be reduced substantially. In addition, it is necessary to carry out an adjustment process at the factory on two frequencies. Thus, the time it takes to carry out the adjustment process can be shortened considerably.

In accordance with the tuning circuits (or the resonance circuits) described above, it is necessary to carry out an adjustment process at the factory on two frequencies such as the lowest tuning frequency ωL and the highest tuning frequency ωH. Thus, the time it takes to carry out the adjustment process can be shortened considerably. In addition, the amount of data obtained as a result of the adjustment process is small. Thus, the storage capacity of a non-volatile memory used for storing the data obtained as a result of the adjustment process can be reduced.

On top of that, it is possible to adjust the antenna tuning circuit and the inter-stage tuning circuit, which together form a variable-band filter for selecting a received signal, in a short period of time and the amount of data obtained as a result of the adjustment process is small. Thus, when employed in a receiver for receiving signals of a broad band by dividing the broad band into a number of sub bands, the antenna tuning circuit and the inter-stage tuning circuit particularly display a good performance. That is to say, it is possible to implement a receiver having an excellent disturbance elimination characteristic obtained as a result of a simple adjustment process. In addition, it is possible to find the tuning frequency ωT by carrying out simple multiplications and simple divisions as is obvious from Equation (11) or (12). Thus, a small load needs to be borne by either of software and hardware.

In addition, the adjustment for the highest tuning frequency ωH corresponding to the smallest capacitance CQ can be carried out independently. Thus, even if a number of variable-capacitance circuits are connected to form a multi-stage configuration, an excellent tracking characteristic can be obtained. On top of that, since a device having a special characteristic is not required, the variable-capacitance tuning circuit can be put in an IC with ease. An example of the device having a special characteristic is a variable-capacitance diode. For a high tuning-frequency variability ratio per band, the use of a variable-capacitance diode entails a high voltage, which requires a high-voltage generation circuit separately from other circuits. In the case of the variable-capacitance tuning circuit according to the present invention, on the other hand, such a high voltage is not necessary. That is to say, the variable-capacitance tuning circuit according to the present invention is capable of operating at a low voltage. Thus, the variable-capacitance tuning circuit according to the present invention offers a merit of allowing a process to put the circuit in an IC to be carried out with ease.

[7]: Other Embodiments

In the case of the embodiments described above, a test signal output by a signal generator is used to carry out tracking adjustment processes for two frequencies, i.e., the lowest tuning frequency ωL and the highest tuning frequency ωH. However, a different tracking adjustment process can also be carried out. For example, in place of the errors ΔQ and ΔP described earlier, errors of the control bits bi at specific frequencies in a band of reception are found. Then, a tracking adjustment process is carried out in order to minimize the average value of the errors. Typically, the specific frequencies in a band of reception correspond to 0%, 25%, 50%, 75% and 100% frequency positions in the reception band. In this case, the 0% frequency position is the lowest tuning frequency ωL, the 100% frequency position is the highest tuning frequency ωH whereas the 25%, 50% and 75% frequency positions are each a frequency position determined by interpolation based on the lowest tuning frequency ωL and the highest tuning frequency ωH as a frequency position between the 0% frequency position and the 100% frequency position.

In the case of the embodiments described above, a test signal output by a signal generator is used to carry out tracking adjustment processes. However, electric waves of actual broadcasts can also be used for carrying out an adjustment, checking or correction process. In this case, received broadcast signals having frequencies close to the lowest tuning frequency ωL and the highest tuning frequency ωH are used for carrying out the adjustment, checking or correction process. As an alternative, a signal generation circuit for generating test signals is embedded in the receiver-circuit IC 10.

On top of that, if the variable-capacitance circuits 2A and 4A employed in respectively the variable-capacitance tuning circuits 2 and 4 shown in FIG. 9 are each designed into a configuration identical with the configuration of the first typical variable-capacitance tuning circuit explained earlier by referring to FIG. 1, the variable-capacitance circuits 2T and 4T are not required. In addition, the tracking adjustment process can be carried out automatically by detecting the level of the intermediate-frequency signal SIF or changes caused by variations of the environment are automatically eliminated in a correction process and the result of the correction process is stored in the non-volatile memory 81. Then, the correction-process result stored in the non-volatile memory 81 is used in a tracking adjustment process at the time a signal is actually received in the field.

In addition, it should be understood by those skilled in the art that a variety of modifications, combinations, sub-combinations and alterations may occur, depending on designs and other factors insofar as they are within the scope of the appended claims or the equivalents thereof.

What is claimed is:

1. A method for adjusting the tuning frequency of a tuning circuit comprised of a coil and a plurality of series circuits Ai, each including a capacitor Ci and a switch device Qi where i=1 to n and where n denotes an integer at least equal to two, by varying said tuning frequency by adjusting a control data bi which turns on and off said switch devices Qi, said method including the steps of:

determining a desired control data bi for a desired tuning frequency from a first control data bi for a tuning frequency equal to a first frequency and a second control data bi for a tuning frequency equal to a second frequency; and applying said desired control data bi to said first switch devices Qi, wherein, said parallel circuit also includes series circuits Aj each including a capacitor Cj other than said capacitor Ci and a switch device Qj other than said switch device Qi where j=one to m, m<n, m denotes an integer at least equal to two, said switch devices Qi are turned on and off in order to carry out a main adjustment process, and said other switch devices Qj are turned on and off in order to carry out a tracking adjustment process.

2. The method of claim 1, including the steps of:

supplying a test signal having a frequency equal to said first frequency to said tuning circuit;

determining the first control data bi for said first frequency equal to said frequency of said test signal;

supplying another test signal having a frequency equal to said second frequency to said tuning circuit;

determining the second control data bi for said second frequency equal to said frequency of said other test signal; and setting control data bi to said switch devices Qi.

3. The method for adjusting the tuning frequency of the tuning circuit in accordance with claim 1, said method including the steps of:

storing said control data bi found for said first frequency and said second frequency in a non-volatile memory in advance; and reading out said control data bi from said non-volatile memory at an operating time to be used in finding control data bi to be applied to said switch devices Qi in order to obtain the tuning frequency of the signal of said desired tuning frequency.

4. The method of claim 1 wherein said switch devices Qi are each a Metal Oxide Semiconductor-Field Effect Transistor.

* * * * *